United States Patent
Tsuchiya

(10) Patent No.: US 7,219,312 B2
(45) Date of Patent: May 15, 2007

(54) METHOD AND PROGRAM FOR SUPPORTING REGISTER-TRANSFER-LEVEL DESIGN OF SEMICONDUCTOR INTEGRATED CIRCUIT

(75) Inventor: Takehiko Tsuchiya, Tokyo (JP)

(73) Assignee: Kabushiki Kaisha Toshiba (JP)

(*) Notice: Subject to any disclaimer, the term of this patent is extended or adjusted under 35 U.S.C. 154(b) by 181 days.

(21) Appl. No.: 11/007,891

(22) Filed: Dec. 8, 2004

(65) Prior Publication Data

US 2005/0102647 A1    May 12, 2005

Related U.S. Application Data

(62) Division of application No. 10/255,530, filed on Sep. 26, 2002, now Pat. No. 6,851,102.

(30) Foreign Application Priority Data

Sep. 27, 2001    (JP)    ............................ P2001-298410

(51) Int. Cl.
*G06F 17/50* (2006.01)
(52) U.S. Cl. ................. 716/1; 716/3; 716/6; 716/18
(58) Field of Classification Search .............. 716/1–6, 716/18
See application file for complete search history.

(56) References Cited

U.S. PATENT DOCUMENTS

| | | | |
|---|---|---|---|
| 5,572,437 A | 11/1996 | Rostoker et al. | |
| 5,696,694 A | 12/1997 | Khouja et al. | |
| 6,292,931 B1* | 9/2001 | Dupenloup | ................... 716/18 |
| 6,609,229 B1 | 8/2003 | Ly et al. | |
| 6,675,364 B1* | 1/2004 | Basto et al. | .................... 716/6 |
| 2002/0162086 A1* | 10/2002 | Morgan | ....................... 716/18 |

FOREIGN PATENT DOCUMENTS

JP    2001-014369    1/2001

\* cited by examiner

*Primary Examiner*—Paul Dinh
(74) *Attorney, Agent, or Firm*—Kilpatrick Stockton LLP

(57) ABSTRACT

A method for supporting the register-transfer-level (RTL) design of a semiconductor integrated circuit, includes reading an RTL description related to the semiconductor integrated circuit into a first memory, the RTL description including a description of a compound block containing a mixture of combinational and non-combinational circuits, analyzing the RTL description, extracting a description of the non-combinational circuit from the compound block description, reading an RTL library into a second memory, comparing the logic of the extracted non-combinational circuit description with the logic of each cell of the RTL library, and in accordance with to a result of the comparison, replacing the extracted non-combinational circuit description with a cell of the RTL library having the same logic as the logic of the extracted non-combinational circuit description. The method may further includes comparing the logics of combinational circuits described in the RTL description with one another and rewriting the RTL description if there are a plurality of combinational circuits of the same logic.

4 Claims, 19 Drawing Sheets

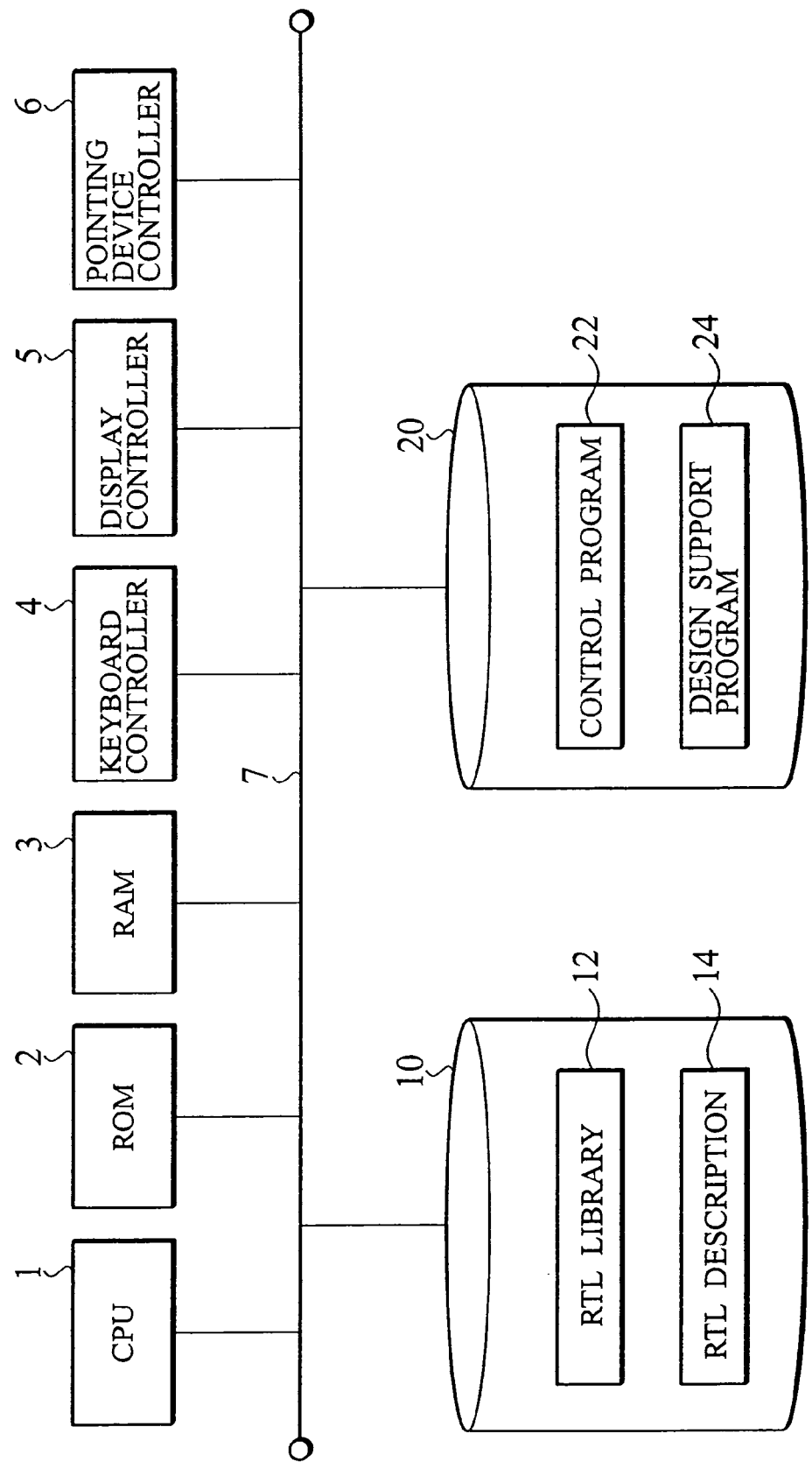

FIG. 3

210 RTL DESCRIPTION BEFORE CHANGE

```
module sub_0(CLK,RESET,EN,HALT,A,B,C,DOUT,
SELO);
input CLK,RESET,EN,HALT;
input [7:0] A,B;
input [2:0] C;
output [7:0] DOUT;
output [1:0] SELO;
reg [7:0] A_r,B_r;
reg [7:0] DOUT_r;
reg [2:0] CAL;
reg [1:0] SEL;
always @(posedge CLK or negedge RESET) begin
        if(~RESET)
                  A_r <= 8'b0000_0000;
 214    else
                  A_r <= A;
end
always @(posedge CLK or negedge RESET) begin
        if(~RESET)
                  B_r <= 8'b0000_0000;
 215    else
                  B_r <= B;
end
always @(posedge CLK or negedge RESET) begin
        if(~RESET)
                  CAL <= 3'b000;
 216    else
                  CAL <= C;
end
always @(CAL) begin
        case(CAL)
                  3'b001:SEL = 2'b00;
                  3'b010:SEL = 2'b01;
                  3'b100:SEL = 2'b10;
                  default:SEL = 2'b11;
        endcase
end
assign SELO = SEL;
always @(posedge CLK) begin
        if(~(EN | HALT)) begin
 212              DOUT_r <= #1 8'b0000_0000;
        end
        else if(SEL == 2'b00) begin
                  DOUT_r <= #1 (A_r & B_r);
        end
        else if(SEL == 2'b01) begin
                  DOUT_r <= #1 (A_r | B_r);
        end
        else if(SEL == 2'b10) begin
                  DOUT_r <= #1 (A_r ^ B_r);
        end
        else begin
                  DOUT_r <= #1 (A_r + B_r);
        end
end
assign DOUT = EN ? DOUT_r:~DOUT_r;
endmodule
```

RTL DESCRIPTION AFTER CHANGE 220

```
module sub_0(CLK,RESET,EN,HALT,A,B,C,DOUT,
SELO);
input CLK,RESET,EN,HALT;
input [7:0] A,B;
input [2:0] C;
output [7:0] DOUT;
output [1:0] SELO;
wire [7:0] DOUT_r;
reg [1:0] SEL;
wire [7:0] A_r,B_r;
wire [2:0] CAL;
wire [7:0] wire_0;                              224

FD2 #(8) A_r_reg(A_r,,A,CLK,RESET);
FD2 #(8) B_r_reg(B_r,,B,CLK,RESET);
FD2 #(3) CAL_reg(CAL,,C,CLK,RESET);

always @(CAL) begin                 226    225
        case(CAL)
                  3'b001:SEL = 2'b00;
                  3'b010:SEL = 2'b01;
                  3'b100:SEL = 2'b10;
                  default:SEL = 2'b11;
        endcase
end assign SELO = SEL;

function [7:0] DOUT_r_func;
input EN,HALT;
input [1:0] SEL;                                222
input [7:0] A,B;
        if(~(EN | HALT)) begin
                  DOUT_r_func = 8'b0000_0000;
        end
        else if(SEL == 2'b00) begin
                  DOUT_r_func = (A & B);
        end
        else if(SEL == 2'b01) begin
                  DOUT_r_func = (A | B);
        end
        else if(SEL == 2'b10) begin
                  DOUT_r_func = (A ^ B);
        end
        else begin
                  DOUT_r_func = (A + B);
        end
endfunction assign wire_0 = DOUT_r_func(EN,HALT,SEL,A_r,
B_r);

FD1 #(8) DOUT_r_reg(DOUT_r,,wire_0,CLK);

assign DOUT = EN ? DOUT_r:~DOUT_r;       228
endmodule
```

FIG. 4

310:
```
module FD1(Q,QN,D,CP);
parameter width = 1;
input CP;
input [width-1:0] D;
output [width-1:0] Q,QN;
reg [width-1:0] Q_r;
wire [width-1:0] Q,QN;

always @(posedge CP)
    begin
        Q_r <= D;
    end
    assign Q = Q_r;
    assign QN = ~Q_r;
endmodule
```

320:
```
module FD2(Q,QN,D,CP,CD);
parameter width = 1;
input CP,CD;
input [width-1:0] D;
output [width-1:0] Q,QN;
reg [width-1:0] Q_r;
wire [width-1:0] Q,QN;

always @(posedge CP or negedge CD)
    begin
        if(!CD)
            Q_r <= {width{1'b0}};
        else
            Q_r <= D;
    end
    assign Q = Q_r;
    assign QN = ~Q_r;
endmodule
```

FIG. 5A

BEFORE DELETION

```
function [7:0] DOUT_1_func;          ⎫
input [7:0] A,B,C;                   ⎬ 332

DOUT_1_func   = (A*B)+C;

endfunc                              ⎭ assign wire_0 = DOUT_1_func(A,B,C)
FD1 #(8)  DOUT_1_reg(DOUT_1,,wire_0,CLK);

function [7:0] DOUT_2_func;          ⎫
input [7:0] A,B;                     ⎬ 334

DOUT_2_func   = A*B;

endfunc                              ⎭ assign wire_1 = DOUT_2_func(A,B)
FD1 #(8)  DOUT_2_reg(DOUT_2,,wire_1,CLK);
```

FIG. 5B

AFTER DELETION

```
function [7:0] DOUT_1_func_a;        ⎫
input [7:0] A,C;                     ⎬ 352

DOUT_1_func_a  = A+C;

endfunc                              ⎭ assign wire_0  = DOUT_2_func(A,B)        } 354
assign wire_0a = DOUT_1_func_a(wire_0,C) } 356

FD1 #(8)  DOUT_1_reg(DOUT_1,,wire_0a,CLK);

function [7:0] DOUT_2_func;
input [7:0] A,B;

DOUT_2_func   = A*B;

endfunc assign wire_1 = DOUT_2_func(A,B)
FD1 #(8)  DOUT_2_reg(DOUT_2,,wire_1,CLK);
```

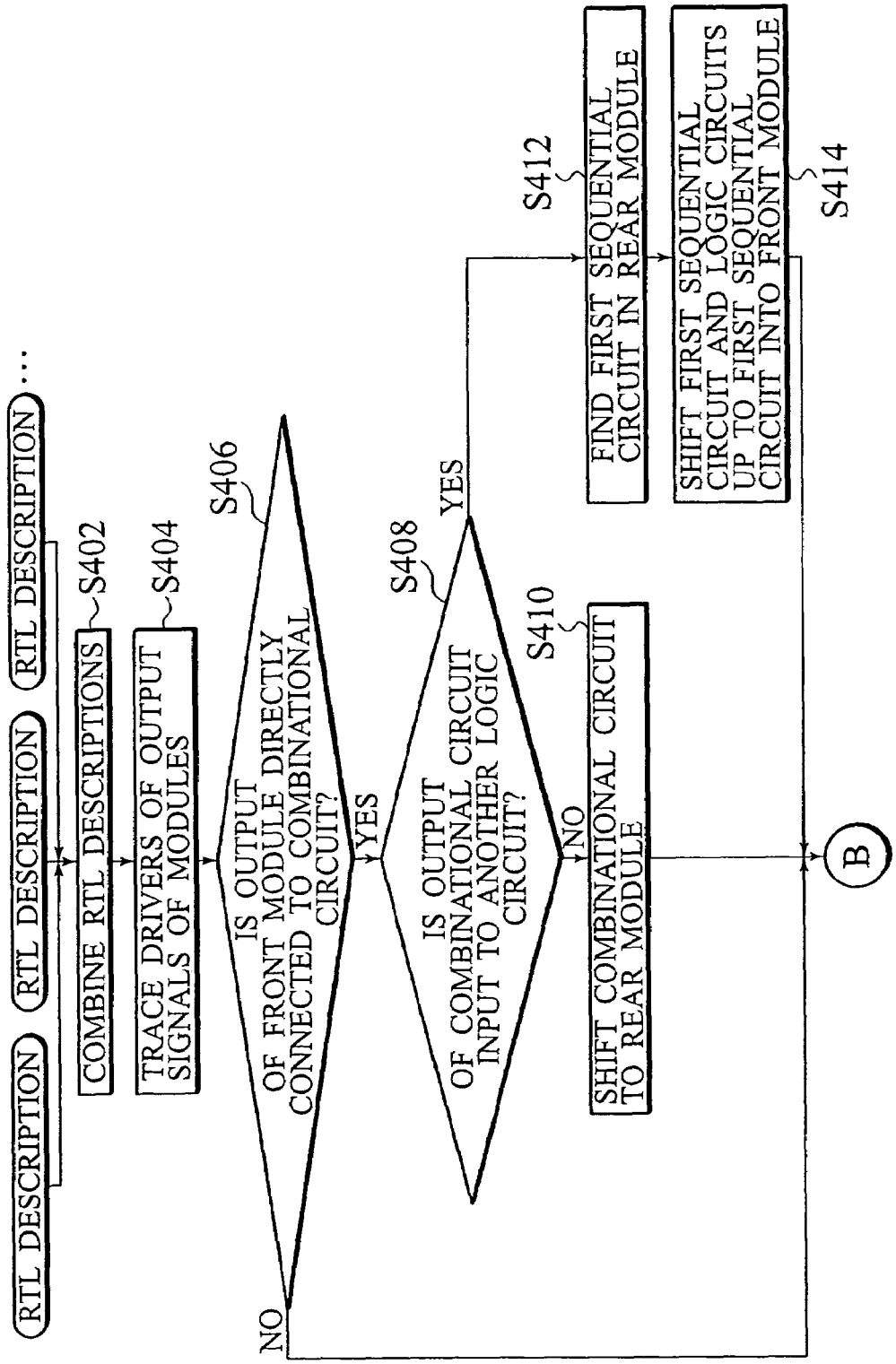

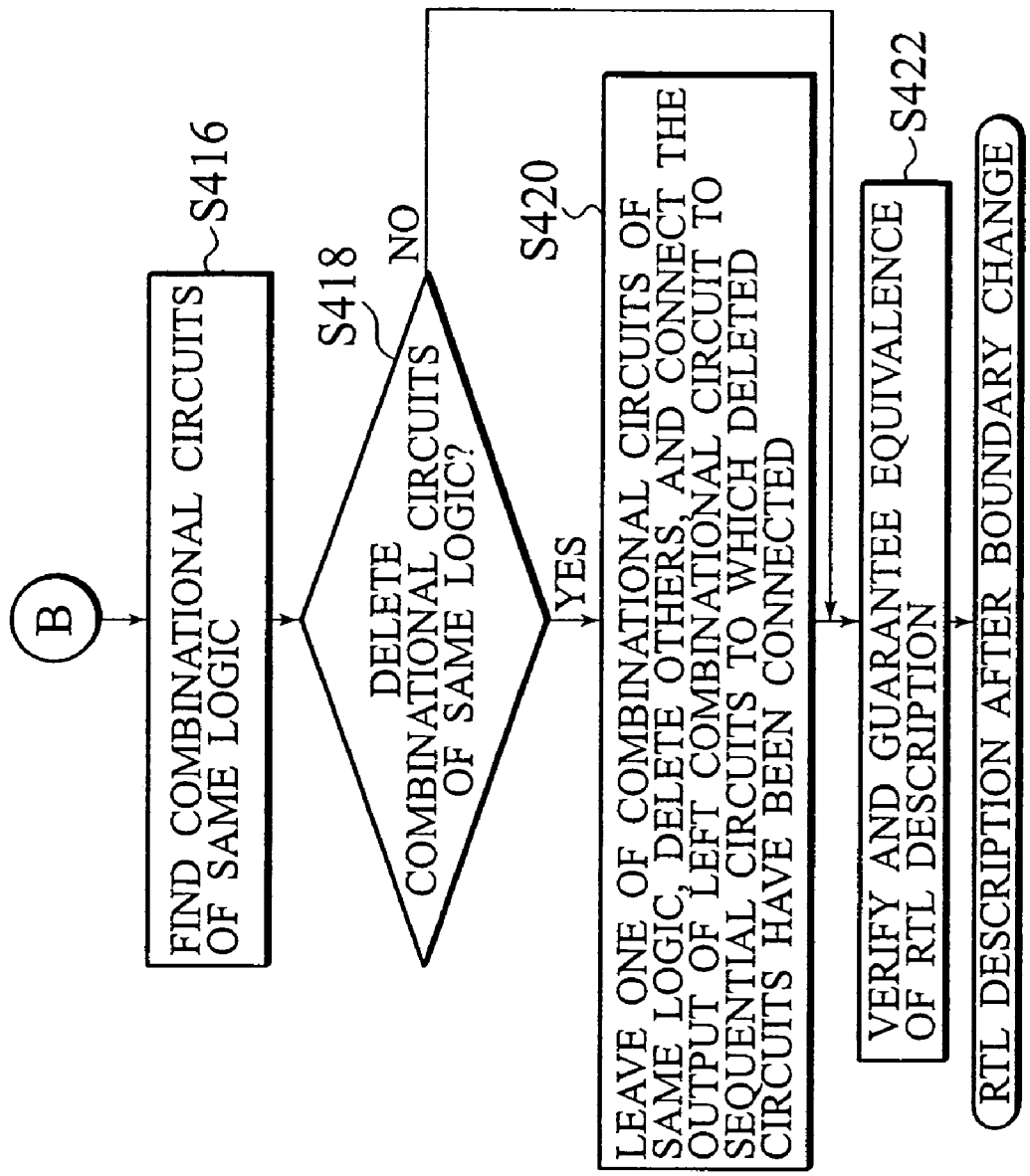

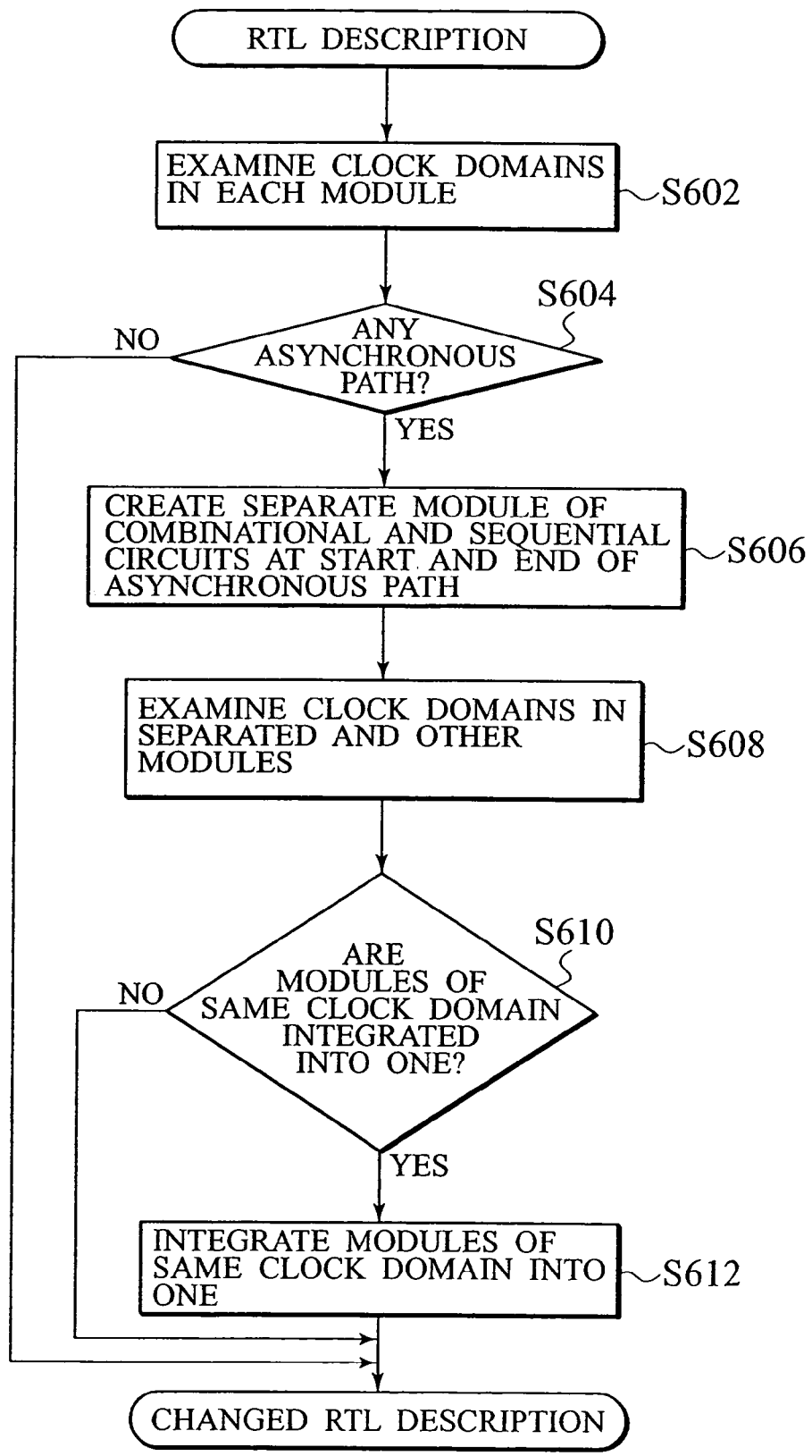

COMBINATIONAL CIRCUIT DIVISION

PIPELINE TIMING

FIG. 14A
BEFORE CHANGE

```
module sub_0 (CLK, RESET, EN, HALT, A, B, C,
DOUT, SELO);
input CLK, RESET, EN, HALT;
input [7:0] A, B;
input [2:0] C;
output [7:0] DOUT;
output [1:0] SELO;
wire [7:0] DOUT_r;
reg [1:0] SEL;
wire [7:0] A_r, B_r;
wire [2:0] CAL;
wire [7:0] wire_0;

FD2 #(8) A_r_reg (A_r,, A, CLK, RESET);
FD2 #(8) B_r_reg (B_r,, B, CLK, RESET);
FD2 #(3) CAL_reg (CAL,, C, CLK, RESET);

always @ (CAL) begin
        case (CAL)
                3'b001:SEL = 2'b00;
                3'b010:SEL = 2'b01;
                3'b100:SEL = 2'b10;
                default:SEL = 2'b11;
        endcase
end assign SELO = SEL;

function [7:0] DOUT_r_func;
input EN, HALT;
input [1:0] SEL;
input [7:0] A, B;
        if (~(EN | HALT)) begin
                DOUT_r_func = 8'b0000_0000;
        end
        else if (SEL == 2'b00) begin
                DOUT_r_func = (A & B);
        end
        else if (SEL == 2'b01) begin
                DOUT_r_func = (A | B);
        end
        else if (SEL == 2'b10) begin
                DOUT_r_func = (A ^ B);
        end
        else begin
                DOUT_r_func = (A + B);
        end
endfunction assign wire_0 = DOUT_r_func (EN, HALT, SEL, A_r, B_r);

FD1 #(8) DOUT_r_reg (DOUT_r,, wire_0, CLK);

assign DOUT = EN ? DOUT_r:~DOUT_r;

endmodule
```

(1212)

FIG. 14B
AFTER COMBINATIONAL CIRCUIT DIVISION

```
module sub_0 (CLK, RESET, EN, HALT, A, B, C,
DOUT, SELO);
input CLK, RESET, EN, HALT;
input [7:0] A, B;
input [2:0] C;
output [7:0] DOUT;
output [1:0] SELO;
wire [7:0] DOUT_r;
reg [1:0] SEL;
wire [7:0] A_r, B_r;
wire [2:0] CAL;
wire [7:0] wire_0;
wire [7:0] wire_1, wire_2, wire_3, wire_4;

FD2 #(8) A_r_reg (A_r,, A, CLK, RESET);
FD2 #(8) B_r_reg (B_r,, B, CLK, RESET);
FD2 #(3) CAL_reg (CAL,, C, CLK, RESET);

always @ (CAL) begin
        case (CAL)
                3'b001:SEL = 2'b00;
                3'b010:SEL = 2'b01;
                3'b100:SEL = 2'b10;
                default:SEL = 2'b11;
        endcase
end assign SELO = SEL;

assign wire_1 = (A & B);
assign wire_2 = (A | B);
assign wire_3 = (A ^ B);
assign wire_4 = (A + B);

function [7:0] DOUT_r_func;
input EN, HALT;
input [1:0] SEL;
input [7:0] wire_1, wire_2, wire_3, wire_4;
        if(~(EN | HALT)) begin
                DOUT_r_func = 8'b0000_0000;
        end
        else if (SEL == 2'b00) begin
                DOUT_r_func = wire_1;
        end
        else if (SEL == 2'b01) begin
                DOUT_r_func = wire_2;
        end
        else if (SEL == 2'b10) begin
                DOUT_r_func = wire_3;
        end
        else begin
                DOUT_r_func = wire_4;
        end
endfunction assign wire_0 = DOUT_r_func (EN, HALT, SEL,
wire_1, wire_2, wire_3, wire_4);

FD1 #(8) DOUT_r_reg (DOUT_r,, wire_0, CLK);

assign DOUT = EN ? DOUT_r:~DOUT_r;

endmodule
```

AFTER REGISTER INSERTION

```
module sub_0 (CLK, RESET, EN, HALT, A, B, C,
DOUT, SELO);
input CLK, RESET, EN, HALT;
input [7:0] A, B;
input [2:0] C;
output [7:0] DOUT;
output [1:0] SELO;
wire [7:0] DOUT_r;
reg [1:0] SEL;
wire [7:0] A_r, B_r;
wire [2:0] CAL;
wire [7:0] wire_0;
wire [7:0] wire_1, wire_2, wire_3, wire_4;
wire [7:0] wire_5;

FD2 #(8) A_r_reg (A_r, , A, CLK, RESET);
FD2 #(8) B_r_reg (B_r, , B, CLK, RESET);
FD2 #(3) CAL_reg (CAL, , C, CLK, RESET);

always @ (CAL) begin
        case (CAL)
                    3'b001:SEL = 2'b00;
                    3'b010:SEL = 2'b01;
                    3'b100:SEL = 2'b10;
                    default:SEL = 2'b11;
            endcase
end assign SELO = SEL;

assign wire_1 = (A & B);
assign wire_2 = (A | B);
assign wire_3 = (A ^ B);
assign wire_4 = (A + B);

FD1 #(8) add_reg (wire_5, , wire_4, CLK);

function [7:0] DOUT_r_func;
input EN, HALT;
input [1:0] SEL;
input [7:0] wire_1, wire_2, wire_3, wire_4;
    if(~(EN | HALT))begin
                DOUT_r_func = 8'b0000_0000;
        end
    else if (SEL == 2'b00) begin
                DOUT_r_func = wire_1;
        end
    else if (SEL == 2'b01) begin
                DOUT_r_func = wire_2;
        end
    else if (SEL == 2'b10) begin
                DOUT_r_func = wire_3;
        end
    else begin
                DOUT_r_func = wire_4;
        end
endfunction assign wire_0 = DOUT_r_func (EN, HALT, SEL,
wire_1,wire_2,wire_3,wire_4,wire_5);

FD1 #(8) DOUT_r_reg (DOUT_r, , wire_0, CLK);
```

} 1302

METHOD AND PROGRAM FOR SUPPORTING REGISTER-TRANSFER-LEVEL DESIGN OF SEMICONDUCTOR INTEGRATED CIRCUIT

CROSS REFERENCE TO RELATED APPLICATIONS

This application is a divisional application of application Ser. No. 10/255,530 filed Sep. 26, 2002.

This application is based upon and claims the benefit of priority from Japanese Patent Application P2001-298410 filed on Sep. 27, 2001, the entire contents of which are incorporated herein by reference.

BACKGROUND OF THE INVENTION

1. Field of the Invention

The present invention relates to a method for supporting and verifying the design of a large-scale integrated circuit (LSI) and a program for executing the method in a computer. In particular, the present invention relates to a top-down design technique employing logic synthesis to automatically change a register transfer level (RTL) description of a hierarchical circuit into one that allows easy design verification.

2. Description of the Related Art

Recent large-scale semiconductor circuits involve a large amount of design data that is difficult to collectively handle in the verification, logic synthesis, and layout stages. To cope with this problem, the design data of a large-scale circuit is usually divided into layers or modules.

There are, however, no established design support methods or programs to effectively divide design data into layers or modules. Accordingly, circuit design projects frequently employ different design support methods or programs, which deteriorate design efficiency.

SUMMARY OF THE INVENTION

According to a first aspect of the present invention, a method for supporting the register-transfer-level design of a semiconductor integrated circuit includes (a) analyzing an RTL description, which is related to the semiconductor integrated circuit and includes a description of a compound circuit consisting of combinational and non-combinational circuits, and extracting the non-combinational circuit description and (b) replacing the extracted non-combinational circuit description with a cell of an RTL library having the same logic as that of the extracted non-combinational circuit description.

According to a second aspect of the present invention, a method for supporting the register-transfer-level design of a semiconductor integrated circuit includes (a) determining whether or not an output of a first module is directly provided from a combinational circuit contained in the first module and whether or not the combinational circuit is independent of the other logic circuits in the first module and (b) if the output of the first module is directly provided from the combinational circuit and if the combinational circuit is independent of the other logic circuits, shifting the combinational circuit from the first module into a second module that follows the first module.

According to a third aspect of the present invention, a method for supporting the register-transfer-level design of a semiconductor integrated circuit includes (a) determining whether or not an output of a first module is directly provided from a combinational circuit contained in the first module and whether or not the combinational circuit is independent of the other logic circuits in the first module and (b) if the output of the first module is directly provided from the combinational circuit and if the combinational circuit is not independent of the other logic circuits, finding a sequential circuit that is contained in a second module, which follows the first module, and is first connected to the combinational circuit and shifting the found sequential circuit and all logic circuits in the second module up to the found sequential circuit from the second module into the first module.

According to a fourth aspect of the present invention, a method for supporting the register-transfer-level design of a semiconductor integrated circuit includes (a) examining clock domains in a first module and (b) if the first module contains first and second clock domains, separating a second module containing an asynchronous path from the first module.

According to a fifth aspect of the present invention, a method for supporting the register-transfer-level design of a semiconductor integrated circuit includes (a) reading descriptions of first and second modules from an RTL description related to the semiconductor integrated circuit into a memory, the second module being in front of the first module; (b) comparing a decrement with an increment which are occurred in the number of connections to the first module if a combinational circuit and a sequential circuit both in the first module are shifted into the second module; and (c) if the decrement is greater than the increment, shifting the descriptions of the combinational circuit and sequential circuit from the first module description into the second module description.

According to a sixth aspect of the present invention, a method for supporting the register-transfer-level design of a semiconductor integrated circuit includes (a) identifying a combinational circuit whose specifications must be changed, (b) dividing the identified combinational circuit into arithmetic descriptions and conditional branch descriptions, and (c) retiming or inserting registers where needed due to the specification change.

BRIEF DESCRIPTION OF THE DRAWINGS

FIG. 1 roughly shows an example of a basic computer structure for achieving methods explained in embodiments of the present invention;

FIG. 3 shows an example of an RTL description before and after change according to the first embodiment;

FIG. 4 shows examples of cells in an RTL library according to the first embodiment;

FIGS. 5A and 5B show an example of an RTL description before and after the deletion of redundant circuits according to the first embodiment;

FIG. 6 is a flowchart showing a flow of optimizing combinational circuits along a module boundary according to a second embodiment of the present invention;

FIG. 8 is a flowchart showing a flow of extracting an asynchronous circuit and creating a separate module according to a third embodiment of the present invention;

FIGS. 9A to 9C show examples of asynchronous circuits and separated modules according to the third embodiment, in which FIG. 9A shows the asynchronous circuits before clock domain adjustment, FIG. 9B shows the same after clock domain adjustment, and FIG. 9C shows two modules separated from different modules and late to be integrated into one;

FIGS. 13A to 13C show an example of a module optimized for a specification change according to the fifth embodiment, in which FIG. 13A shows a combinational circuit before division, FIG. 13B shows a divided combinational circuit before pipeline retiming, and FIG. 13C shows the divided combinational circuit after pipeline retiming;

FIGS. 14A and 14B show an example of an RTL description before and after division of a combinational circuit according to the fifth embodiment;

FIG. 15 shows an example of an RTL description after register insertion according to the fifth embodiment.

DETAILED DESCRIPTION OF EMBODIMENTS

Figure 2A:
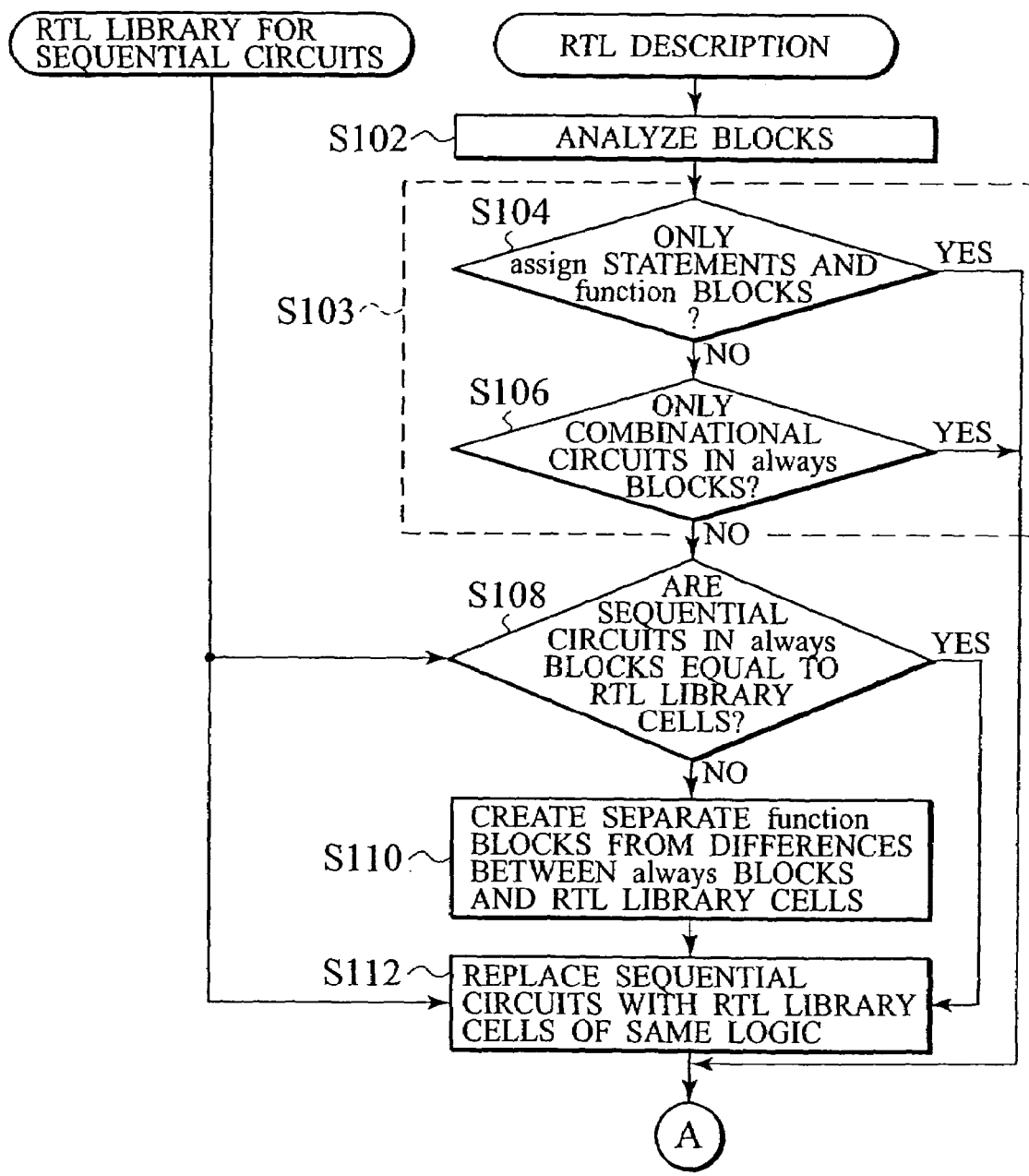
FIG. 2 is a flowchart showing a method of supporting the register-transfer-level design of a semiconductor integrated circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention with unnecessary detail.

Methods for supporting layer (module) division design of semiconductor integrated circuits studied by the present inventor have the following problems:

(1) Difficulty in carrying out logic synthesis on modules having combinational circuits along the boundary between them due to difficulty of preparing boundary conditions (2) Difficulty in carrying out timing verification on large-scale circuits at high speed with the use of static timing analyses for synchronous elements and simulations for asynchronous elements, due to difficulty in clarifying boundaries between the synchronous elements and the asynchronous elements (3) Difficulty in handling many connection signals and wiring congestion if strong correlation is present between modules in a floor plan (4) Difficulty in rewriting RTL descriptions and inserting registers if specifications such as pipeline retiming are changed during designing (5) Difficulty in maintaining a correlation between RTL descriptions and net lists if the hierarchical structure is changed during logic synthesis, and difficulty in maintaining the performance of debugging and formal verification if problems occur in the net lists.

The present inventor reached the following embodiments in consideration of these problems.

First Embodiment

As shown in FIGS. 1 to 5B, the first embodiment of the present invention is a preprocess for the second to fifth embodiments of the present invention. To carry out the second to fifth embodiments, an RTL description must have clearly separated combinational circuits and sequential circuits. An RTL description containing mixed combinational circuits and sequential circuits must be processed by the first embodiment in order to separate them from each other. Any RTL description including combinational circuits and sequential circuits clearly separated from each other can directly be handled by the second to fifth embodiments without the first embodiment.

FIG. 1 roughly shows an example of a basic computer structure applicable to the first to fifth embodiments of the present invention. The computer includes a CPU 1, a ROM 2, a RAM 3, a keyboard controller 4 to control a keyboard, a display controller 5 to control a display, a pointing device controller 6 to control a pointing device such as a mouse, touch pad, and trackball, a data storage unit 10 to store an RTL library 12 and RTL descriptions 14, and a program storage unit 20 to store a control program 22 and a design support program 24. These parts are connected to one another through a bus 7.

When the computer is turned on, a startup program is read from the ROM 2 to start the computer. The control program 22 is read into the RAM 3. Further, the design support program 24, RTL library 12, and RTL descriptions 14 are read into the RAM 3, to start a design process. The control program 22 includes an operation system. The design support program 24 executes any one of the first to fifth embodiments in the computer.

The CPU 1 follows instructions provided by the control program 22 and design support program 24, to transfer data from the RTL library 12 and RTL descriptions 14 in the RAM 3 to registers (not shown) in the CPU 1, process the data, and rewrite the data in the RAM 3. If required, the CPU 1 displays, on the display (not shown) through the display controller 5, messages to prompt a designer (user) to enter numerical values or instructions for optional processes.

The user may use the keyboard to enter numerical values through a numerical value input screen, or the pointing device such as a mouse, trackball, or track pad to push a YES button or a NO button on an option selection screen. The bus 7 may include peripheral component interconnect (PCI) buses and industrial standard architecture (ISA) buses. The data storage unit 10 and program storage unit 20 may be hard disk drives, tape drives, magneto-optical disk drives, CD-ROMs, CD-Rs, CD-RWs, DVD-ROMs, DVD-Rs, DVD-RAMs, and the like. FIG. 1 is intended as an example and not as an architectural limitation of the present invention.

Figure 2B:
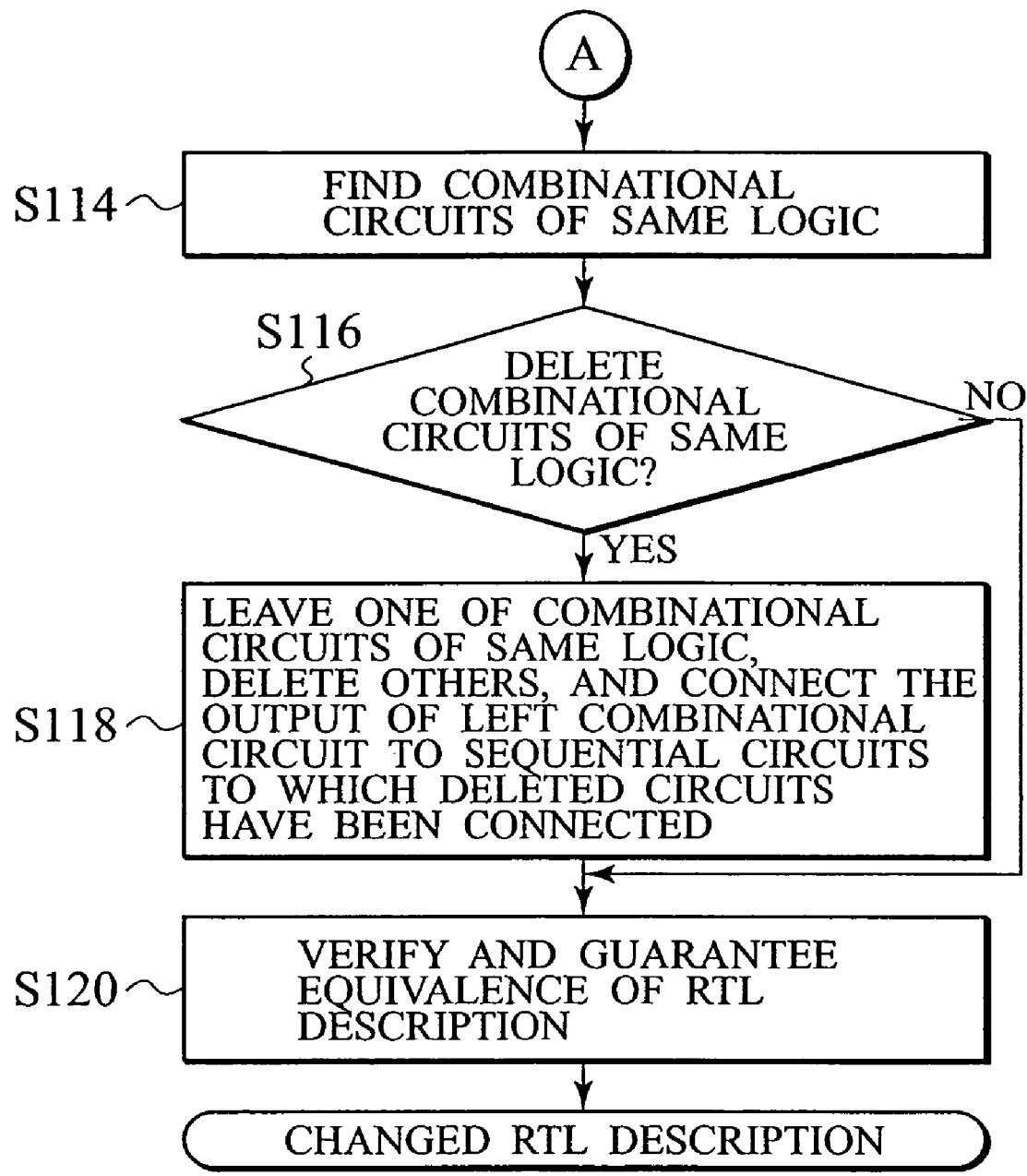

FIG. 2 is a flowchart showing a method of supporting the register-transfer-level design of a semiconductor integrated circuit according to the first embodiment. Step S102 analyzes each block in an RTL description. Step S103 determines whether or not there is a block describing a non-combinational circuit. If there is, step S112 replaces the block describing a non-combinational circuit with a cell contained in the RTL library 12 and having the same logic as the logic of the replaced block. The non-combinational circuit may be a sequential circuit or a memory circuit.

(1) Step S102 analyzes each statement or block in a given RTL description. FIG. 3 shows examples of RTL descriptions, i.e., an RTL description 210 before change and an RTL description 220 after change. The RTL description 210 contains blocks 212, 214, 215, and 216. The RTL description 210 with these blocks is read from the data storage unit 10 into the RAM 3.

(2) Step S103 checks to see if the RTL description 210 includes a block describing a non-combinational circuit such as a sequential circuit. More precisely, step S104 checks to see if the RTL description 210 contains only "assign" statements or "function" blocks. Step S106 checks to see if the RTL description 210 contains only "always" blocks describing only combinational circuits.

The assign statement starts with "assign." The function block starts with "function" and ends with "endfunction." The always block starts with "always" and ends with "end." The CPU 1 checks to see if the RTL description 210 loaded in the RAM 3 contains statements each starting with "assign," blocks each starting with "function" and ending with "endfunction," and blocks each starting with "always" and ending with "end," thereby determining whether or not the RTL description 210 contains, for example, only assign statements and function blocks. The assign statement and function block are used to describe combinational circuits. The assign statement is used to describe a simple combinational circuit. The function block is used to describe an intricate combinational circuit. An RTL description containing only assign statements and function blocks is understood as describing only combinational circuits. The always block is mainly used to describe a sequential circuit and sometimes a combinational circuit. Some always blocks describe a mixture of a sequential circuit, which is a non-combinational circuit, and a combinational circuit.

Step S104 branches to YES if the RTL description 210 contains only assign statements and function blocks and to NO if the RTL description 210 contains blocks other than the assign statements and function blocks.

Step S106 branches to YES if the RTL description 210 contains only always blocks describing only combinational circuits and to NO if the RTL description 210 contains blocks other than the always blocks consisting of only combinational circuits.

(3) In step S108, the CPU 1 compares the logic of each block in the RTL description 210 with the logic of each cell in the RTL library 12, to check to see if they are equal to each other. Namely, step S108 checks to see if a block in the RTL description 210 is replaceable with one of the cells in the RTL library 12. The RTL library 12 is stored in the data storage unit 10 in advance.

FIG. 4 shows examples of cells in the RTL library 12. The logic of each block in the RTL description 210 of FIG. 3 is compared with the logic of each of the cells 310 and 320 of FIG. 4, to see if they are equal to each other. If the logic of every block in the RTL description 210 is equal to the logic of the cells 310 or 320, step S108 branches to YES, and if not, to NO. In FIG. 4, there are only two cells 310 and 320 in the RTL library 12 for the sake of clarity of explanation. In practice, the RTL library 12 may have an optional number of cells.

(4) Step S110 compares the logic of each block in the RTL description 210 with the logic of each cell in the RTL library 12, finds a difference between the logic of the compared block and the logic of an approximate cell found in the RTL library 12, and creates a separate function block corresponding to the difference. If there are a plurality of cells whose logic is close to that of the compared block, a cell that minimizes a description of the differential logic is chosen. For example, a cell that involves a minimum number of RTL description lines to describe the differential logic is chosen. When preparing the separate function block for the differential logic, original signal names are kept and new intermediate variables are added to connections to the sequential circuit. In this way, the processes mentioned above convert an RTL description into combinational circuit descriptions and RTL library cells and provide them in the form of a hardware description language (HDL) text file.

In FIG. 3, an always block 212 is converted into the cell 310 of FIG. 4 plus a function block 222, which corresponds to the difference between the always block 212 and the cell 310.

(5) Step S112 replaces a sequential circuit in the RTL description 210 with a cell in the RTL library 12 having the same logic as that of the sequential circuit. For example, the always blocks 214 to 216 in the RTL description 210 each have the same logic as that of the cell 320 of FIG. 4, and therefore, are replaced with FD2 224 to 226, respectively, as is shown in the RTL description 220 of FIG. 3.

The difference between the always block 212 in the RTL description 210 and the function block 222 in the RTL description 220 corresponds to the cell 310 of FIG. 4. Accordingly, the difference is replaced with FD1 228 as shown in the RTL description 220.

(6) Step S114 compares the logics of combinational circuits in the RTL description 210 with one another, and if there are a plurality of combinational circuits of the same logic, prepares a report. The report may be a message of "There are a plurality of combinational circuits of the same logic" displayed on the display (not shown) through the display controller 5 (FIG. 1).

The RTL description 210 of FIG. 3 has no circuits having the same logic, and therefore, no report is provided to indicate that there are a plurality of combinational circuits of the same logic.

FIG. 5A shows another example of an RTL description. This RTL description includes a DOUT_1_func block 332 and a DOUT_2_func block 334 containing each a combinational circuit of the same logic of "A*B." In this case, a report is provided to indicate that there are combinational circuits of the same logic.

(7) Step S116 prompts the user to determine whether or not the combinational circuits of the same logic must be deleted as redundant. If the user determines to delete the redundancy, step S116 branches to YES, and if not, to NO.

(8) Step S118 leaves one of the combinational circuits of the same logic and deletes the others. If the user specifies the circuit to be left, the specified circuit is left and the others are deleted. If the user specifies no circuit to be left, the first redundant circuit in the RTL description is left, and the other redundant circuits are deleted. An output of the left combinational circuit is connected to sequential circuits to which the deleted circuits have been connected.

An example of this will be explained with reference to FIGS. 5A and 5B. The redundant circuit (A*B) is deleted from the DOUT_1_func block 332, to make a DOUT_1_func_a block 352. As shown in assign statements 354 and 356, the output of the left combinational circuit is connected to the sequential circuit to which the deleted circuit has been connected.

The user may specify circuits to be left or deleted through the keyboard controller 4 or the pointing device controller 6.

(9) Step S120 carries out formal verification on the RTL description 210 and RTL description 220, to guarantee logic equivalence before and after the RTL description change.

In this way, the first embodiment processes an RTL description in which combinational circuits and sequential circuits are not clearly separated from each other, to provide an RTL description in which combinational circuits and sequential circuits are clearly separated from each other. The process of partly deleting a plurality of combinational circuits of the same logic may be carried out if needed. Even without the partial deletion operation, the present invention is capable of providing an RTL description in which combinational circuits are clearly separated from sequential circuits.

The embodiments mentioned below employ such an RTL description in which combinational circuits are clearly separated from sequential circuits.

Second Embodiment

Figure 7A:
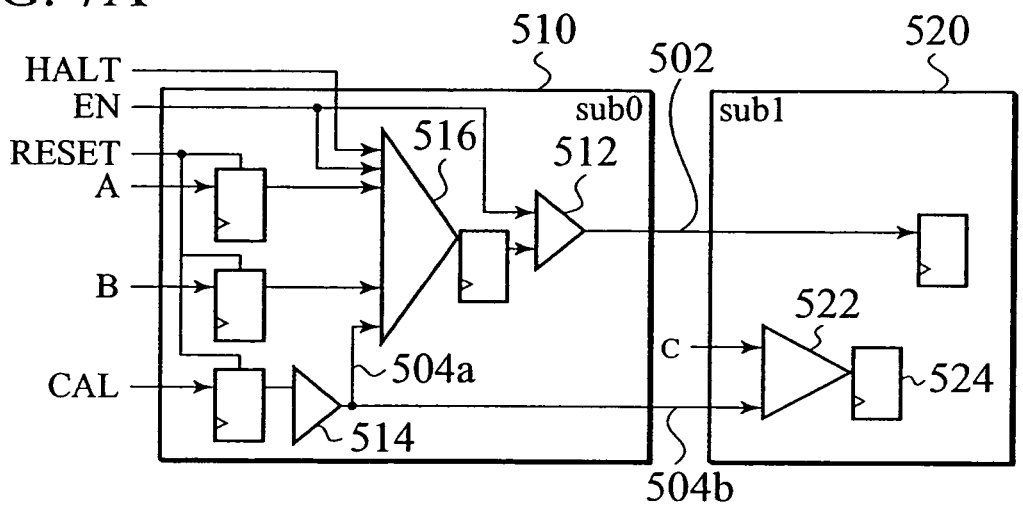
FIGS. 7A and 7B show examples of modules before and after boundary optimization according to the second embodiment.
Figure 7B:
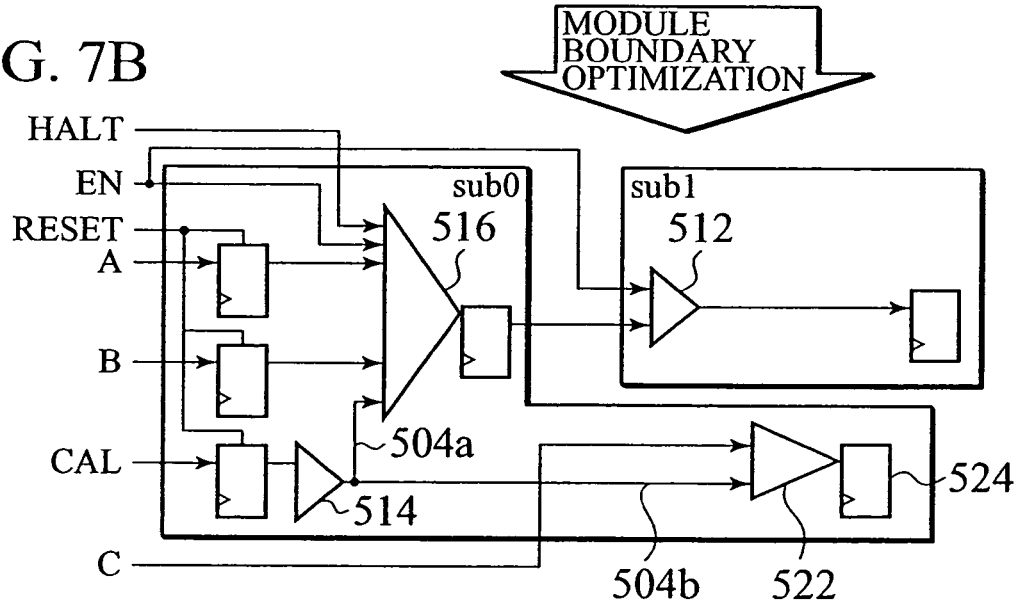

As shown in FIGS. 6 to 7B, the second embodiment relates to an optimization of combinational circuits along a module boundary. The second embodiment examines whether or not an output 502 of a first module 510 is directly provided from a combinational circuit 512 in the first module 510 and whether or not the combinational circuit is independent of the other logic circuits in the first module 510. If the output 502 of the first module 510 is directly provided from the combinational circuit 512 and if the combinational circuit 512 is independent of the other logic circuits in the first module 510, the second embodiment shifts the combinational circuit 512 into a second module 520 that follows the first module 510.

On the other hand, an output 504b of the first module 510 is provided directly from a combinational circuit 514 but the combinational circuit 514 is not independent of the other logic circuits in the first module 510. In this case, the second embodiment finds a sequential circuit 524 in the second module 520 first connected to the combinational circuit 514 and shifts the found sequential circuit 524 and all logic circuits up to the circuit 524 into the first module 510.

(1) Step S402 combines RTL descriptions in which combinational circuits are clearly separated from sequential circuits, to form a system.

(2) Step S404 finds a driver for each output of a front (upstream) module.

(3) Step S406 determines whether or not an output of the front module is directly provided from a combinational circuit in the front module. If the output of the front module is directly from a combinational circuit, step S406 branches to YES, and if not, to NO. In FIG. 7A, the outputs 502 and 504b of the front module 510 are directly provided from the combinational circuits 512 and 514, respectively.

(4) Step S408 determines whether or not the output of the combinational circuit that directly provides the output of the front module is input to another logic circuit in the same module. If so, step S408 branches to YES, and if not, to NO.

For example, the CPU 1 (FIG. 1) prepares, based on an RTL description 14 loaded in the RAM 3, a table showing outputs of combinational circuits that directly provide outputs of a module and a table showing inputs of logic circuits in the same module. With these tables, it is determined whether or not an output of a combinational circuit is input to another logic circuit.

An assumption is made that there is a module containing the following two assign statements:

assign $c = a$ & $b$ assign $e = c + d$

In this case, "c" is included in a table containing "assign c=a & b" as well as in a table containing "assign e=c+d," and therefore, it is determined that an output of the combinational circuit is an input to the logic circuit.

In FIG. 7A, the output 502 of the combinational circuit 512 is not an input to any other logic circuit in the same module 510. The output 504a of the combinational circuit 514 is an input to another circuit 516 in the same module 510.

(5) Step S410 shifts the circuit negated in step S408 to a rear (downstream) module. In FIGS. 7A and 7B, the combinational circuit 512 is an example of a circuit to be shifted from the front module 510 into the rear module 520. In the RTL description 14 loaded in the RAM 3, the CPU 1 deletes a description related to the combinational circuit 512 from a description related to the module 510 and adds the deleted one to a description related to the module 520.

(6) Step S412 finds a sequential circuit in the rear module first connected to the circuit asserted in step S408. In FIG. 7A, the circuit asserted in step S408 is the combinational circuit 514, the rear module of the combinational circuit 514 is the module 520, and the sequential circuit in the rear module 520 first connected to the combinational circuit 514 is the sequential circuit 524. In the RTL description 14 loaded in the RAM 3, the CPU 1 deletes descriptions related to a combinational circuit 522 and the sequential circuit 524 from the description related to the module 520 and adds them to the description related to the module 510.

(7) Step S416 compares the logics of combinational circuits, and if there are a plurality of combinational circuits of the same logic, prepares a report.

(8) Step S418 prompts the user to determine whether or not the combinational circuits of the same logic must be deleted as redundant. If the user determines to delete them, step S418 branches to YES, and if not, to NO.

(9) Step S420 leaves one of the combinational circuits of the same logic and deletes the others. If the user specifies the redundant circuit to be left, the specified one is left and the others are deleted. If the user specifies no redundant circuit to be left, the first redundant circuit in the RTL description is left and the other redundant circuits are deleted. An output of the left combinational circuit is connected to sequential circuits to which the deleted circuits have been connected.

(10) Step S422 carries out formal verification on the RTL description before change and the RTL description after change, to guarantee logic equivalence before and after the RTL description change.

In this way, the second embodiment is capable of preparing an RTL description having a module structure whose output terminal is always directly connected to an output of a sequential circuit, to enable hierarchical logic synthesis and static timing analysis.

The process of partly deleting a plurality of combinational circuits of the same logic may be carried out if needed. Even if the partial deletion operation is omitted, the effect of the second embodiment will be maintained.

Third Embodiment

Figure 9A:
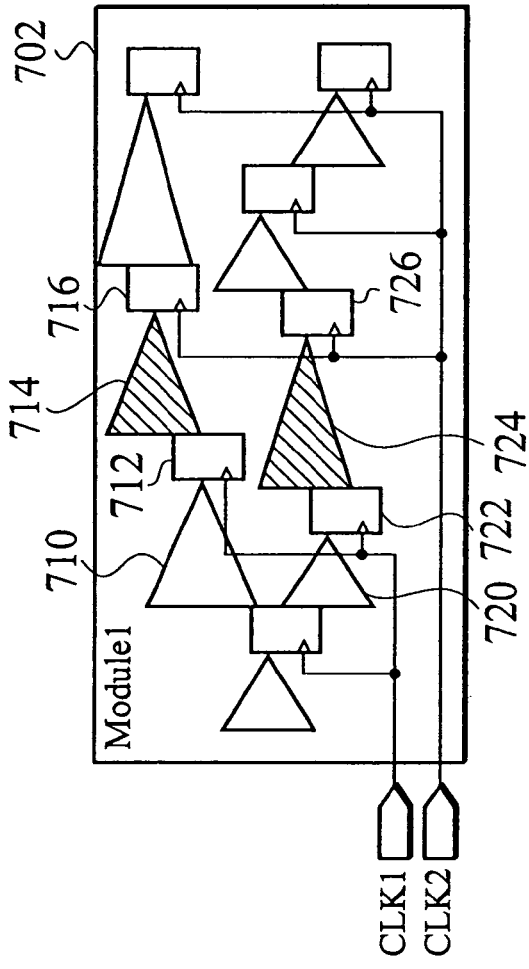
Figure 9B:
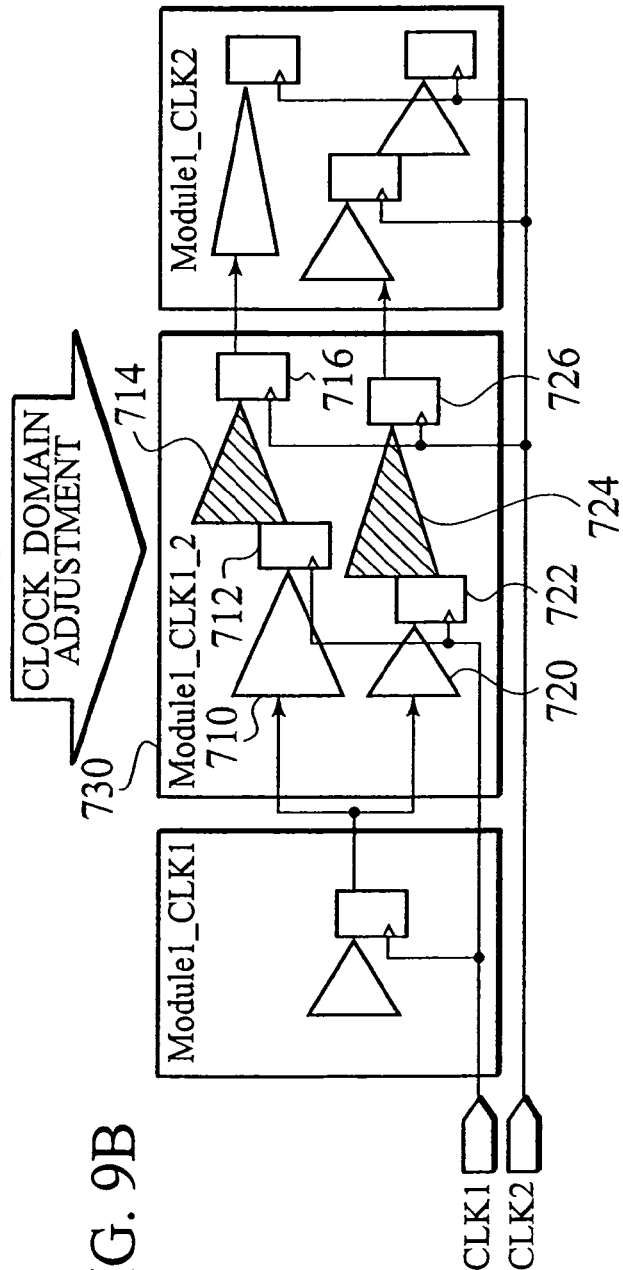
Figure 9C:
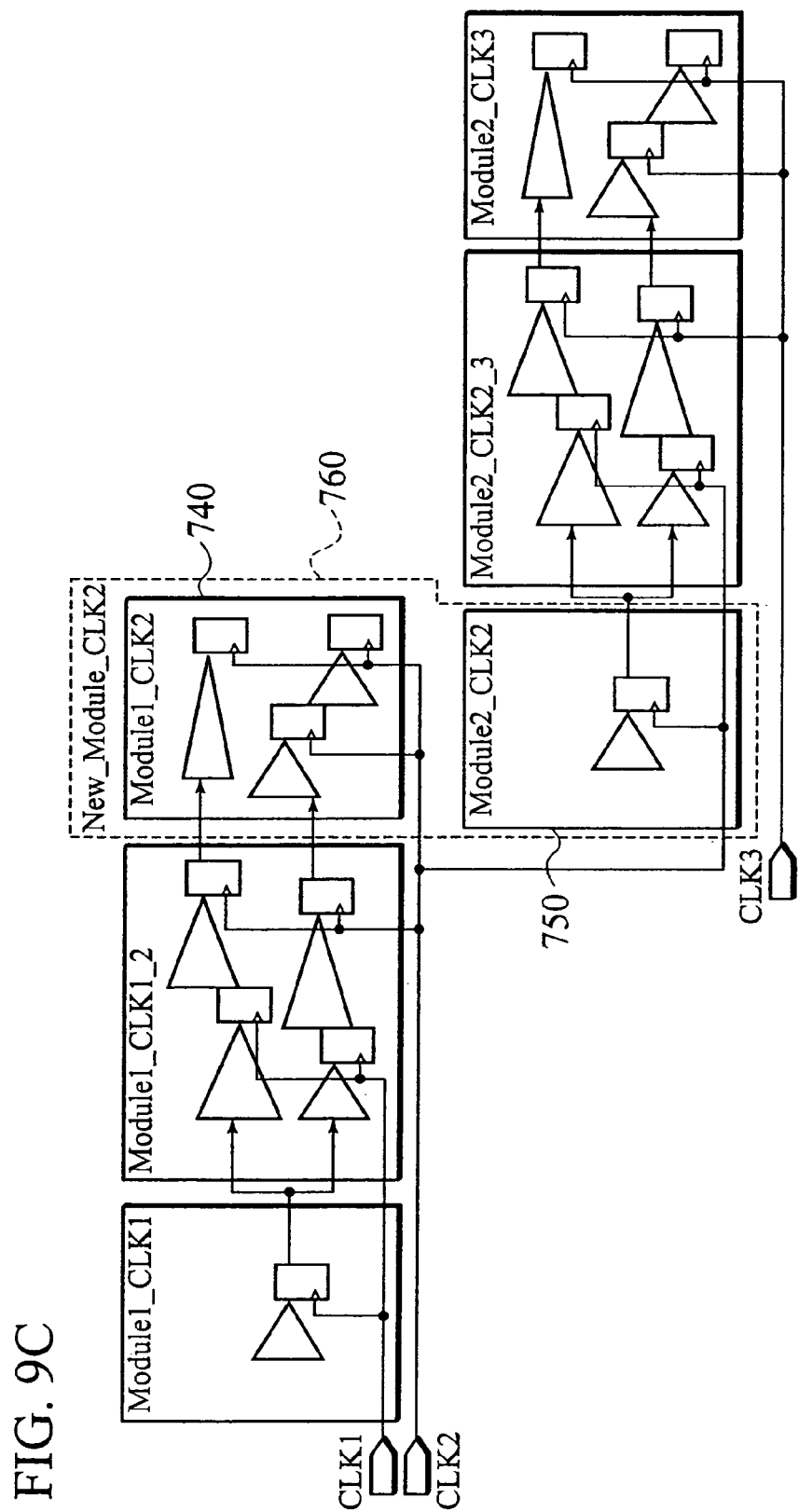

As shown in FIGS. 8 to 9C, the third embodiment relates to an extraction of an asynchronous circuit and the creation of a separate module. The third embodiment examines clock domains in a first module 702, and if there are first and second clock domains in the first module 702, separates a second module 730 including asynchronous paths 714 and 724 from the first module 702.

(1) Step S602 examines clock domains in each module in an RTL description in which combinational circuits are clearly separated from sequential circuits, to determine whether or not there are asynchronous paths in the module. For example, step S602 examines clock domains in the module 702 of FIG. 9A. The CPU 1 (FIG. 1) prepares a list of descriptions related to clock signals in an RTL description 14 loaded in the RAM 3.

(2) Step S604 branches to YES if there are asynchronous paths in the examined module and to NO if there are no asynchronous paths therein. The asynchronous path is a path having input and output ends connected to different clock signals.

For each description related to a path (including circuits) in the RTL description 14 loaded in the RAM 3, the CPU 1 compares a description related to a clock of an input end circuit with a description related to a clock of an output end circuit. If there is a clock difference between the input and output end circuits, the CPU 1 determines that there is an asynchronous path.

In FIG. 9A, a path 714 involves an input end circuit 712 connected to a clock signal CLK1 and an output end circuit 716 connected to a clock signal CLK2. The path 714, therefore, is an asynchronous path. Similarly, a path 724 involves an input end circuit 722 connected to the clock signal CLK1 and an output end circuit 726 connected to the clock signal CLK2. Accordingly, the path 724 is an asynchronous path. Due to these asynchronous paths, step S604 branches to YES.

(3) Step S606 (a) identifies a sequential circuit at the start of an asynchronous path and a sequential circuit at the end of the asynchronous path and (b) creates a new module with the sequential circuit connected to the start of the path, a combinational circuit just before the start sequential circuit, the sequential circuit connected to the end of the path, and a combinational circuit just before the end sequential circuit.

For the RTL description 14 loaded in the RAM 3, the CPU 1 (a) identifies a description related to a sequential circuit at the start of an asynchronous path and a description related to a sequential circuit at the end of the asynchronous path and (b) forms a description related to a new module from the description related to the sequential circuit at the path start, a description related to a combinational circuit just before the start sequential circuit, the description related to the sequential circuit at the path end, and a description related to a combinational circuit just before the end sequential circuit.

In FIGS. 9A and 9B, (a) the sequential circuit 712 at the start of the asynchronous path 714, the sequential circuit 716 at the end of the path 714, the sequential circuit 722 at the start of the asynchronous path 724, and the sequential circuit 726 at the end of the path 724 are identified and (b) a new module 730 (Module1_CLK1_2) is created to include the sequential circuit 712 connected to the start of the path 714, a combinational circuit 710 just before the sequential circuit 712, the sequential circuit 716 at the end of the path 714, the combinational circuit 714, i.e., the asynchronous path 714 just before the sequential circuit 716, the sequential circuit 722 connected to the start of the path 724, a combinational circuit 720 just before the sequential circuit 722, the sequential circuit 726 connected to the end of the path 724, and the combinational circuit 724, i.e., the asynchronous path 724 just before the sequential circuit 726.

(4) Step S608 examines clock domains in each module created from the existing modules and prepares a report. For example, second, third, and fourth modules may be separated from the first module, and sixth, seventh, and eighth modules may be separated from the fifth modules. Step S608 examines clock domains in each of these separated modules and prepares a report.

(5) Step S610 prompts the user to determine whether or not modules of the same clock domain should be integrated into one. If they are to be integrated into one, step S610 branches to YES, and if not, to NO.

(6) Step S612 integrates modules of the same clock domain into one. In FIG. 9C, modules 740 and 750 are integrated into a module 760.

In this way, the third embodiment is capable of automatically forming a separate module for an asynchronous path, to improve the efficiency of partial delay simulations and gate-level verification. As shown in FIG. 9C, the number of the clock domains may be equal to or more than three.

It is preferable to carry out formal verification on an original RTL description and an RTL description prepared according to the third embodiment, to guarantee logical equivalence between them.

Fourth Embodiment

Figure 10:
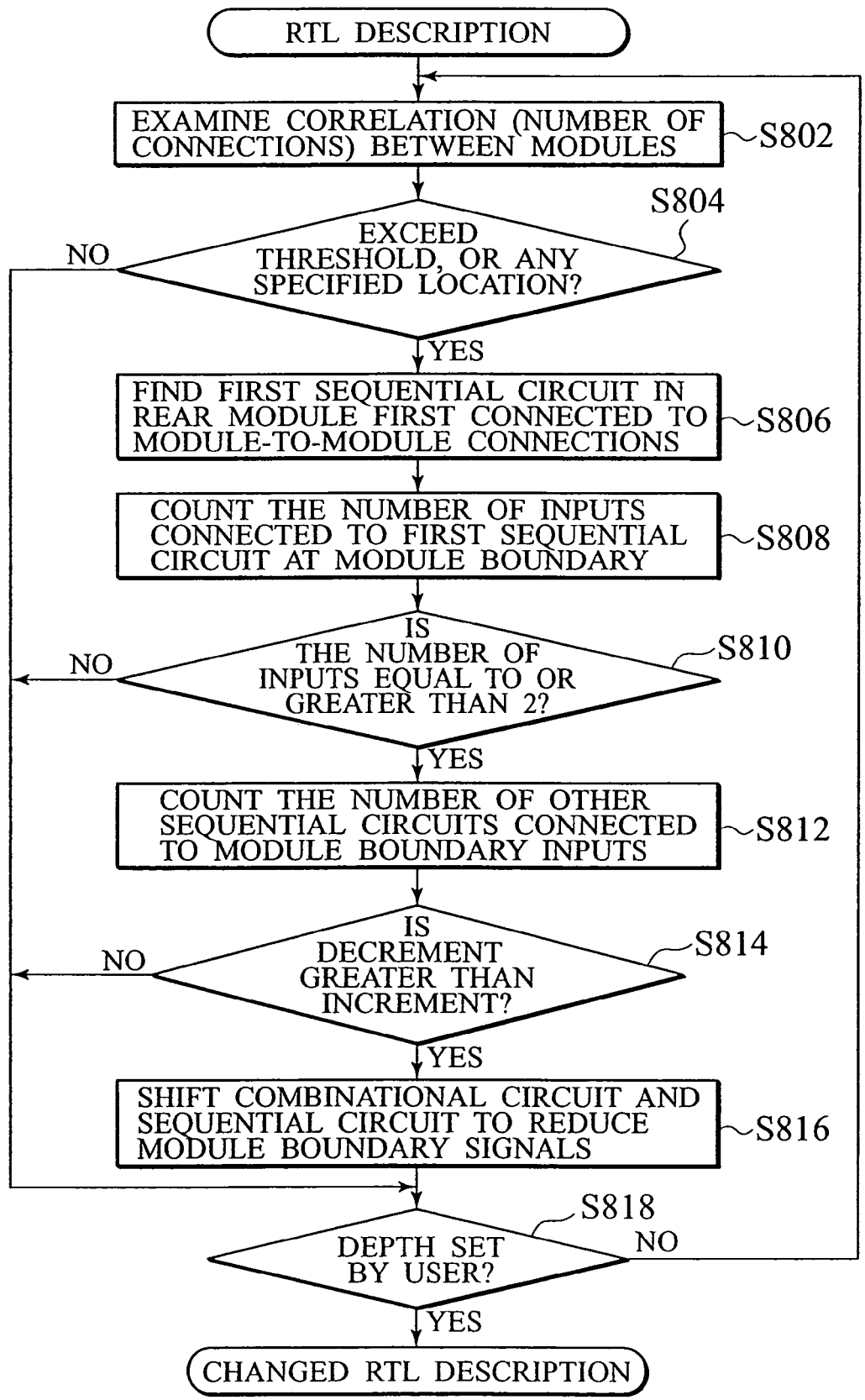
FIG. 10 is a flowchart showing a flow of reducing correlation (the number of signals) between modules according to a fourth embodiment of the present invention.
Figure 11A:
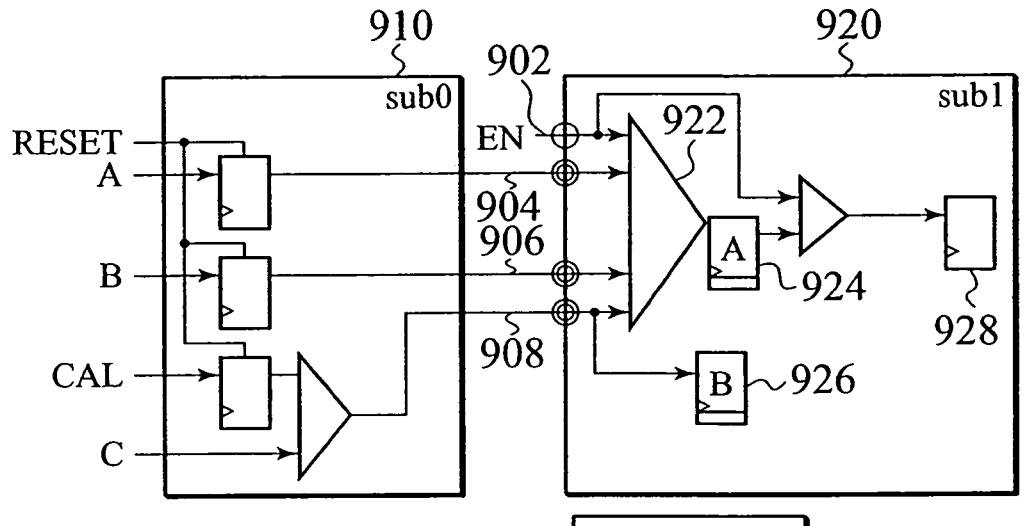
FIGS. 11A and 11B show examples of modules before and after correlation reduction according to the fourth embodiment.
Figure 11B:
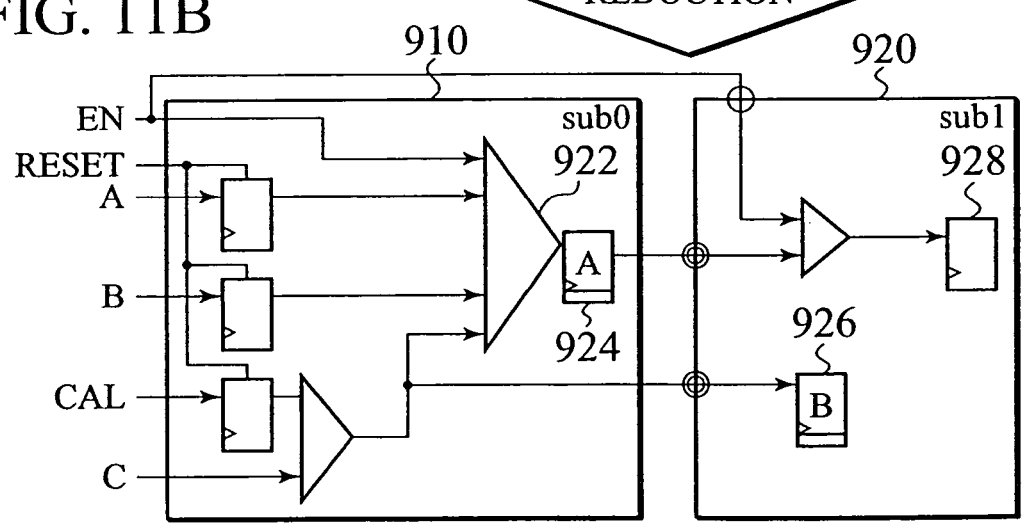

As shown in FIGS. 10 to 11B, the fourth embodiment relates to module optimization in consideration of a module-to-module correlation (the number of module-to-module signals). The fourth embodiment makes an assumption that a combinational circuit 922 and a sequential circuit 924 are shifted from a first module 920 into a second module 910 that is in front of the first module 920. Then, the fourth embodiment compares a decrement in the number of connections to the first module 920 due to the shift with an increment in the number of connections to the first module 920 due to the shift.

If the decrement is greater than the increment, the fourth embodiment shifts the combinational circuit 922 and sequential circuit 924 from the first module 920 into the second module 910.

According to the fourth embodiment, the sequential circuit 924 is a sequential circuit to which module-to-module connections 904, 906, and 908 between the first and second modules 920 and 910 are first connected in the first module 920.

According to the fourth embodiment, the combinational circuit 922 is a combinational-circuit through which the module-to-module connections 904, 906, and 908 are passed to the sequential circuit 924.

(1) Step S802 finds a module-to-module correlation, i.e., the number of module-to-module signals and prepares a report. The CPU 1 (FIG. 1) reads descriptions related to the start and end of each module from an RTL description 14 loaded in the RAM 3, reads descriptions related to module-to-module connection signals, and counts the number of connection signals. For example, the CPU 1 reads descriptions related to output and input signals used by first, second, third, and the like modules, determines, as a module-to-module connection signal, each signal that is described as an output of the first module and as an input of the second module, and counts the number of such signals. In FIG. 11A, the number of signals 904, 906, and 908 between the modules 910 and 920 is counted and reported.

(2) In step S804, the CPU 1 (FIG. 1) finds two modules having a correlation exceeding a predetermined threshold, or the user specifies according to the report, two modules whose correlation must be reduced. If there are no such two modules whose correlation exceeds the threshold and if the user specifies no modules for correlation reduction, step S804 branches to NO. If there are two modules whose correlation exceeds the threshold, or if the user specifies two modules to reduce correlation, step S804 branches to YES. In FIG. 11A, the fourth embodiment employs a threshold of, for example, 2 or 1, and therefore, the modules 910 and 920 are chosen for correlation reduction, or the user specifies them as objects for correlation reduction.

(3) Step S806 finds a sequential circuit (first sequential circuit) in a rear module first connected to signals between the object modules whose correlation must be reduced. In the RTL description 14 loaded in the RAM 3, the CPU 1 finds a sequential circuit in the rear module first connected to the module-to-module connection signals identified as mentioned above. For example, the CPU 1 reads a description of the module that receives the module-to-module connection signals from the RTL description 14, reads a description of a circuit that is in the module and receives the module-to-module connection signals, and determines whether the description of the circuit consists of an assign statement or a function block representing a combinational circuit, or an always statement representing a sequential circuit. In FIG. 11A, the signals 904, 906, and 908 between the modules 910 and 920 are connected to sequential circuits 924 and 926 in the rear module 920, and therefore, these sequential circuits 924 and 926 are found as first sequential circuits in the rear module 920. The first sequential circuits include not only the sequential circuit 926 directly connected to the module-to-module connection signals 904, 906, and 908 but also the sequential circuit 924 connected to the connection signals through the combinational circuit 922. There is no sequential circuit between the signals 904, 906, and 908 and the sequential circuit 924, and therefore, the sequential circuit 924 is the first sequential circuit.

(4) Step S808 prepares a table showing (a) the number of first sequential circuits connected to an input of the rear module and (b) the number of inputs of the rear module connected to the first sequential circuits. In FIG. 11A, the table prepared by the CPU 1 and stored in the RAM 3 shows that:
  (a-1) an input 902 of the rear module 920 is connected to one sequential circuit 924;
  (a-2) the input 904 of the rear module 920 is connected to one sequential circuit 924;
  (a-3) the input 906 of the rear module 920 is connected to one sequential circuit 924;
  (a-4) the input 908 of the rear module 920 is connected to two sequential circuits 924 and 926;
  (b-1) four inputs 902, 904, 906, and 908 of the rear module 920 are connected to the sequential circuit 924; and
  (b-2) one input 908 of the rear module 920 is connected to the sequential circuit 926.

(5) Step S810 checks to see if the first sequential circuits are connected to two or more inputs. If so, step S810 branches to YES, and if not, to NO. The first sequential circuit 924 is connected to the four inputs 902, 904, 906, and 908, and therefore, step S810 branches to YES.

Among the first sequential circuits, a sequential circuit to which two or more inputs are connected is an object to be shifted. The sequential circuit 924 is one of the first sequential circuits and is connected to the four inputs 902, 904, 906, and 908, and therefore, is an object to be shifted.

(6) Step S812 counts the number of other sequential circuits connected to the module boundary inputs that are connected to the first sequential circuit to be shifted. In FIG. 11A, the following numbers are counted:
  (a) The number of sequential circuits other than the sequential circuit 924, connected to the input 902 is 0.
  (b) The number of sequential circuits other than the sequential circuit 924, connected to the input 904 is 0.
  (c) The number of sequential circuits other than the sequential circuit 924, connected to the input 906 is 0.
  (d) The number of sequential circuits other than the sequential circuit 924, connected to the input 908 is 1.

(7) Step S814 makes an assumption that the shifting sequential circuit is shifted to the front module and checks to see if a decrement in the number of the module-to-module connections due to the shift is greater than an increment in the number of the module-to-module connections due to the shift.

The decrement is calculated by subtracting "1" from the number of the inputs connected to the shifting sequential circuit. The increment is equal to the number of the other sequential circuits counted in step S812. Step S814 branches to YES if the decrement is greater than the increment, and if not, to NO.

In FIG. 11A, the number of inputs connected to the sequential circuit 924 to be shifted is 4. Accordingly, the decrement is "4−1=3." The other sequential circuits to which the inputs connected to the sequential circuit 924 are connected are only the sequential circuit 926 to which the input 908 is connected. Accordingly, the number of the other sequential circuits is 1. The decrement of 3 is greater than the increment of 1, and therefore, step S814 branches to YES.

(8) Step S816 shifts the sequential circuit and combinational circuit, to reduce the number of the module boundary signals. Namely, the sequential circuit to be shifted and the combinational circuit connected to the sequential circuit are shifted from the rear module into the front module. In FIGS. 11A and 11B, the sequential circuit 924 and combinational circuit 922 are shifted from the module 920 into the module 910.

(9) Step S818 checks to see if steps S802 to S816 have been repeated to a depth set by the user, the depth being represented with an ordinal number. If the steps have not been repeated to the set depth, step S818 branches to NO, and if they have, to YES. The depth is the position of a sequential circuit in a module counted from an input end of the module and is set by the user with an ordinal number. In FIG. 11A, the sequential circuits 924 and 926 are first sequential circuits positioned at a first depth, and a sequential circuit 928 is a second sequential circuit positioned at a second depth.

In this way, the fourth embodiment is capable of reducing a correlation between modules, thereby reducing the number of bypass wires when laying out modules and improve the efficiency of layout work.

Fifth Embodiment

Figure 12:
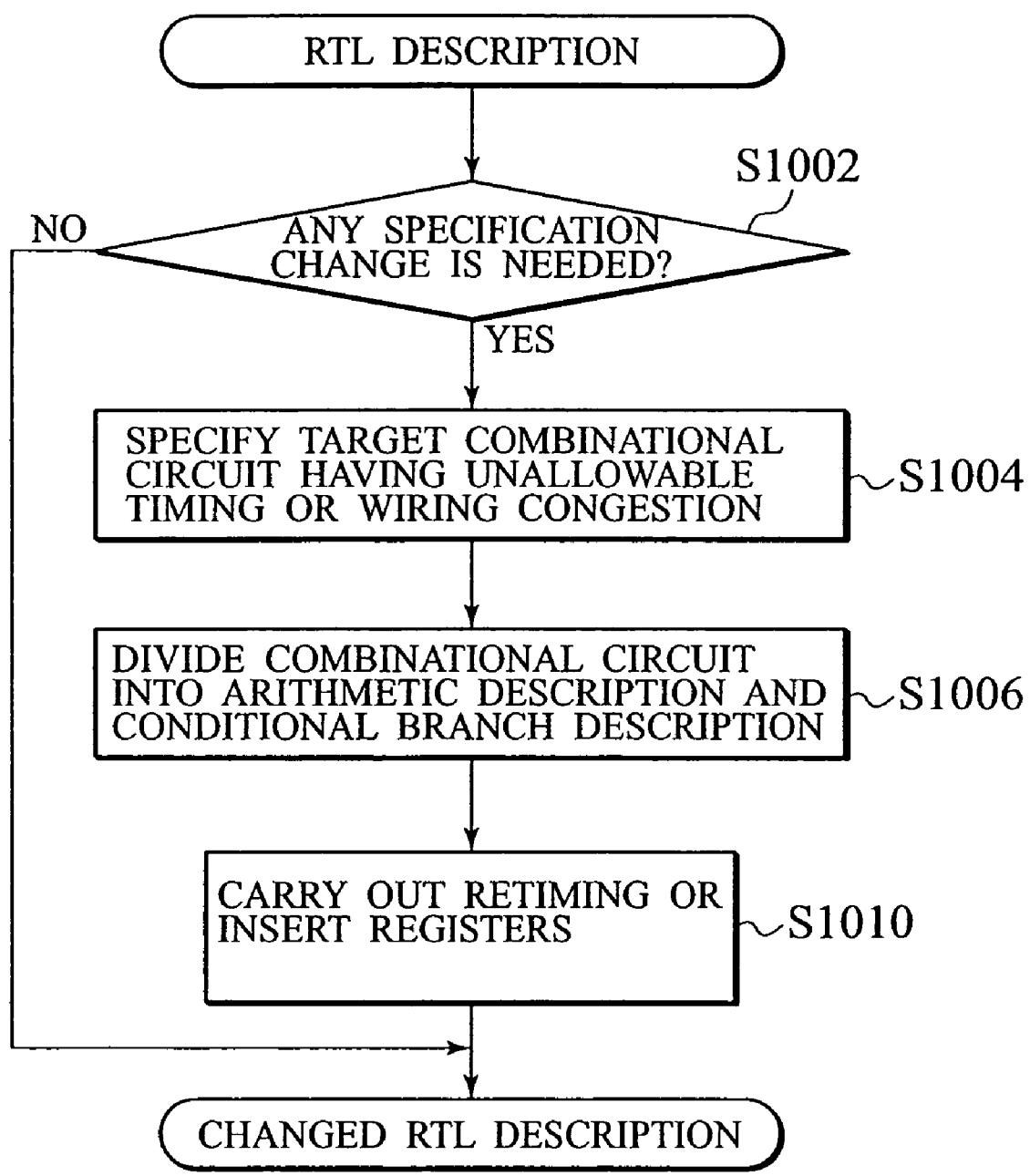
FIG. 12 is a flowchart showing a flow of optimizing a module when changing the specifications thereof according to a fifth embodiment of the present invention.
Figure 13A:
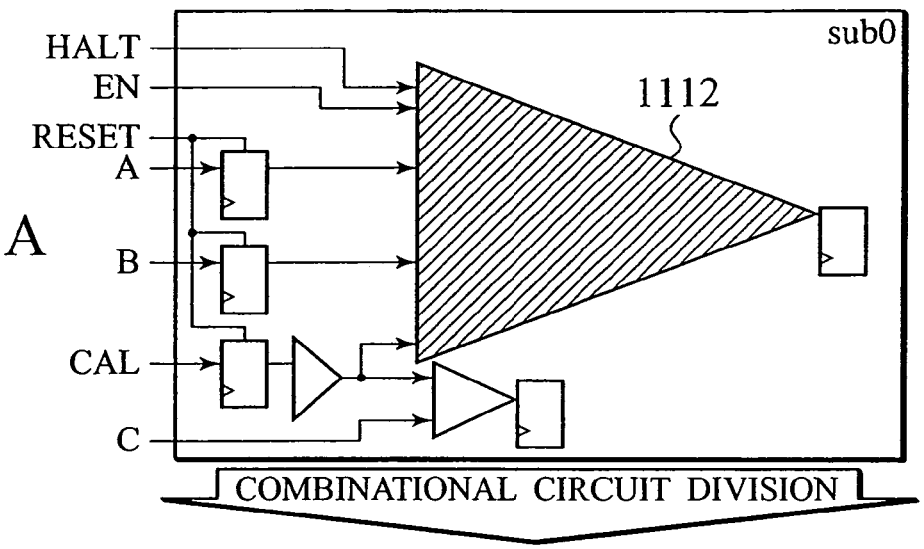
Figure 13B:
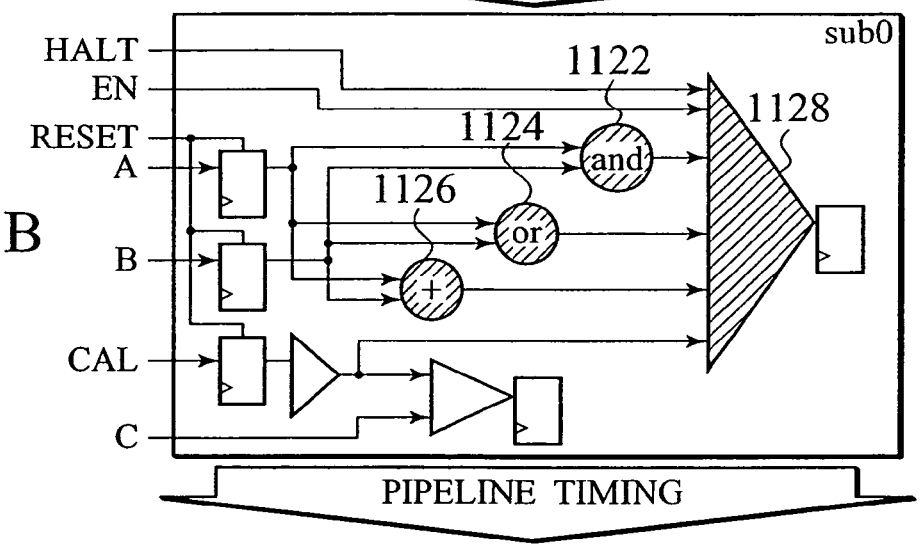
Figure 13C:
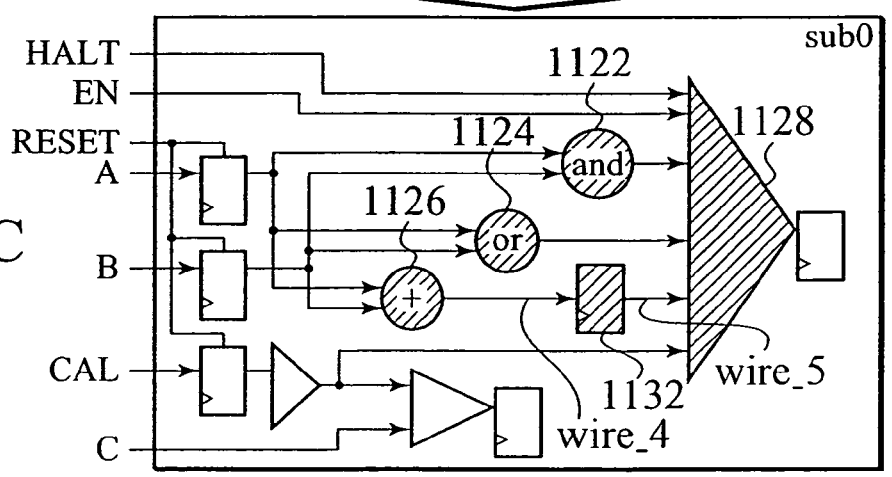

As shown in FIGS. 12 to 13C, the fifth embodiment of the present invention relates to module optimization for specification change. The fifth embodiment specifies a combinational circuit 1112 to change specifications thereof, divides the inside of the combinational circuit 1112 into arithmetic logic descriptions and conditional branch descriptions, and carries out retiming or inserts a register 1132 where needed due to the specification change.

(1) Step S1002 prompts the user to determine whether or not specification change is needed. For example, the CPU 1 (FIG. 1) reads a program to display a specification change inquiry screen from the design support program 24 and displays the inquiry screen on the display (not shown) through the display controller 5. The read program may call a WWW browser to read and display a specification change inquiry HTML file. If the user chooses a specification change on the inquiry screen, step S1002 branches to YES, and if not, to NO.

(2) Step S1004 prompts the user to specify a combinational circuit whose specifications must be changed. For example, the CPU 1 reads a program to display a screen to specify a circuit whose specifications must be changed on the display (not shown) through the display controller 5. The screen may be displayed by using a WWW browser and an HTML file. The user may employ a pointing device such as a mouse to specify one or more specification changing circuits among circuits displayed on the screen, or may employ a keyboard to enter the names of the specification changing circuits. In this way, any circuit that has, for example, a wiring problem of unacceptable timing or congestion is specified as a combinational circuit whose specifications must be changed.

(3) Step S1006 divides the inside of the specified combinational circuit into arithmetic logic descriptions and conditional branch descriptions. For example, the CPU 1 divides a description loaded in the RAM 3 for the combinational circuit 1112 (containing a mixture of arithmetic logic and conditional branch descriptions) into descriptions for logic circuits 1122 and 1124, a description for an arithmetic circuit 1126, and a description for a conditional branch circuit 1128 as shown in FIG. 13B. In addition, the CPU 1 extracts logic and arithmetic descriptions from a function block 1212 of FIG. 14A and divides it into four assign statements 1222 of FIG. 14B.

(4) According to the instruction entered by the user, step S1010 changes the specifications of the combinational circuit. For example, step S1010 shifts locations of severe timing in the combinational circuit into a front combinational circuit, or inserts new sequential circuits. In FIG. 13C, a sequential circuit 1132 is inserted between the arithmetic circuit 1126 and the conditional branch circuit 1128. In this case, the CPU 1 processes an RTL description 14 loaded in the RAM 3, to add an FD statement 1302 related to a register add_reg having the input wire wire_4 to receive an operation result of (A+B) and the output wire wire_5, as shown in FIG. 15.

The ordinary skilled person in the art will understand that register may be inserted not only between an output of arithmetic logic circuit and an input of conditional branch circuit but also between an output of conditional branch circuit and an input of arithmetic logic circuit.

In this way, the fifth embodiment divides a combinational circuit and easily inserts a sequential circuit to an optional location, thereby improving the efficiency of specification change in an RTL description.

The steps of each design support method of the embodiments mentioned above may be written into a program. The program may be stored in a storage medium and is read and executed by a computer, to achieve the steps of the method. The storage medium may be a memory device, a magnetic disk drive, an optical disk drive, a magnetic tape drive, and the like capable of storing programs.

Figure 16:
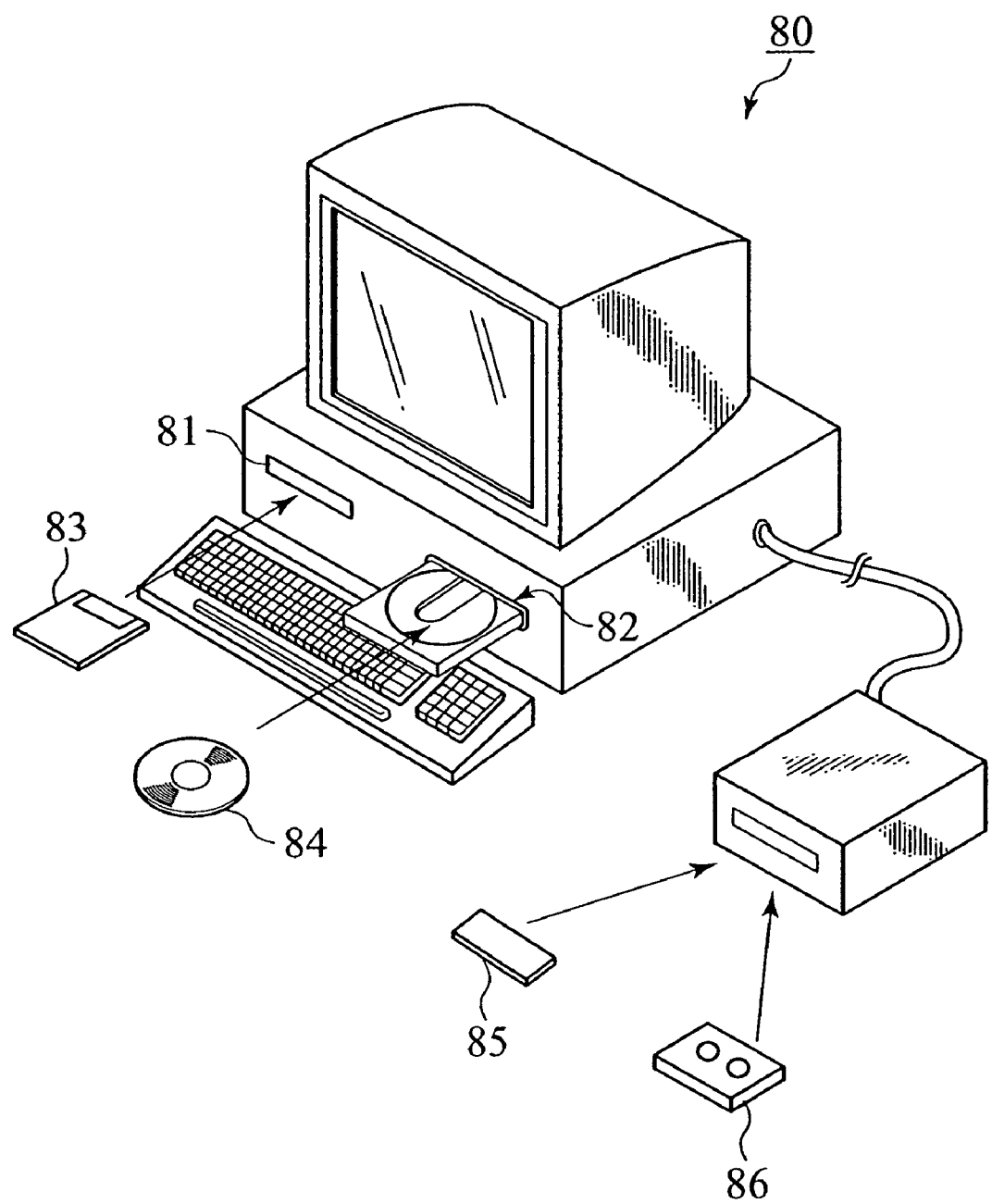
FIG. 16 roughly shows an example of a computer system for reading and executing a program to achieve a method of the present invention.

FIG. 16 roughly shows an example of a computer system to read a program based on the present invention from a storage medium and run the program to process data in accordance with steps written in the program. The computer system 80 has on its front panel a floppy disk drive 81 and a CD-ROM drive 82. The drive 81 receives a floppy disk 83 that is a magnetic disk, and the drive 82 receives a CD-ROM 84 that is an optical disk. Programs stored in these disks are read by and executed in the computer system 80. Any drive may be connected to the computer system 80, to handle, for example, a ROM 85 serving as a game pack and a cassette tape 86 that is a magnetic tape.

In this way, the present invention may employ any storage medium to store, carry, and execute the program to provide the effectiveness of the present invention of realizing easy and speedy design.

The embodiments mentioned above employ Verilog-HDL. The present invention, however, is not restricted to a specific hardware description language. The present invention may employ, for example, Very high speed integrated circuit Hardware Description Language (VHDL), Unified Design Language for Integrated circuit (UDL/I), and Structured Function description Language (SFL). Also employable for the present invention are languages such as C usable as hardware description languages.

Various modifications will become possible for those skilled in the art after receiving the teachings of the present disclosure without departing from the scope thereof.

What is claimed is:

1. A computer implemented method for supporting a register-transfer-level (RTL) design having a description of a module of a semiconductor integrated circuit, comprising:
    storing the description into a memory;
    examining whether the module contains a plurality of clock domains;
    if the module contains the plurality of clock domains, dividing the module into a plurality of divided modules by separating a part including an asynchronous path between the plurality of clock domains from the module, the asynchronous path having input and output ends connected to different clock signals; and
    integrating at least two of the plurality of clock domains having a same clock and existing in the plurality of divided modules into one.

2. The method of claim 1, wherein the part including the asynchronous path further includes a first sequential circuit located at the start of the asynchronous path, a first combinational circuit located just before the first sequential circuit, a second sequential circuit located at the end of the asynchronous path and a second combinational circuit located just before the second sequential circuit.

3. A computer program product stored on a computer readable medium to be executed by a computer, for supporting a register-transfer-level (RTL) design having a description of a module of a semiconductor integrated circuit, comprising:
    instructions configured to store the description into a memory;
    instructions configured to examine whether the module contains a plurality of clock domains;
    instructions configured to divide the module into a plurality of divided modules by separating, if the module contains the plurality of clock domains, a part including an asynchronous path between the plurality of clock domains from the module, the asynchronous path having input and output ends connected to different clock signals; and
    instructions configured to integrate at least two of the plurality of clock domains having a same clock and existing in the plurality of divided modules into one.

4. The computer program product of claim 3, wherein the part including the asynchronous path further includes a first sequential circuit located at the start of the asynchronous path, a first combinational circuit located just before the first sequential circuit, a second sequential circuit located at the end of the asynchronous path, and a second combinational circuit located just before the second sequential circuit.

* * * * *